(12) United States Patent
Sasson et al.

(10) Patent No.: US 6,708,027 B1
(45) Date of Patent: Mar. 16, 2004

(54) METHOD AND APPARATUS FOR HARMONIC FREE GENERATION IN MULTIPLE MIXING FREQUENCY CONVERSION

(76) Inventors: Nir Sasson, Hasayfan St., POB 246, Ein-Sarid 40697 (IL); Raanan Yechezkel, Knobelstrasse 4a, Munich (DE)

(*) Notice: Subject to any disclaimer, the term of this patent is extended or adjusted under 35 U.S.C. 154(b) by 0 days.

(21) Appl. No.: 09/539,996

(22) Filed: Mar. 30, 2000

Related U.S. Application Data
(60) Provisional application No. 60/126,804, filed on Mar. 30, 1999.

(51) Int. Cl.[7] .............................. H04B 1/26; H04B 15/00
(52) U.S. Cl. ........................ 455/314; 455/315; 455/313; 455/207; 455/208; 455/209
(58) Field of Search ................................ 455/313, 314, 455/339, 302, 306, 307, 315, 197.1, 205, 206, 207, 208, 209; 348/725, 726; 725/151

(56) References Cited

U.S. PATENT DOCUMENTS

| | | | |
|---|---|---|---|
| 4,403,252 A | * | 9/1983 | Ragan et al. |
| 4,553,264 A | | 11/1985 | Hasegawa et al. |
| 5,548,839 A | * | 8/1996 | Caldwell et al. |
| 5,918,168 A | | 6/1999 | Abe et al. |
| 6,002,924 A | * | 12/1999 | Takano |
| 6,057,876 A | * | 5/2000 | Waight |

OTHER PUBLICATIONS

"UHF Technology for the Cordless Revolution," Electronics World and Wireless World, Reed Business Publishing, Sutton, Surrey, GB; vol. 99, No. 1688, Jul. 1, 1993, pp. 542–546, XP000378437, ISSN: 0959–8332.

* cited by examiner

Primary Examiner—Lee Nguyen
Assistant Examiner—Huy Nguyen

(57) ABSTRACT

A method is provided for selecting the frequencies of local oscillators and intermediate frequency converters of a receiver that selects the frequency for a first intermediate frequency converter, selects a frequency for a first local oscillator above the frequency of the first intermediate frequency converter to provide an overlapping harmonic first gap, and selects a frequency for a second local oscillator to provide a harmonic gap overlapping said first gap.

3 Claims, 2 Drawing Sheets

Suggested scheme spectral representation

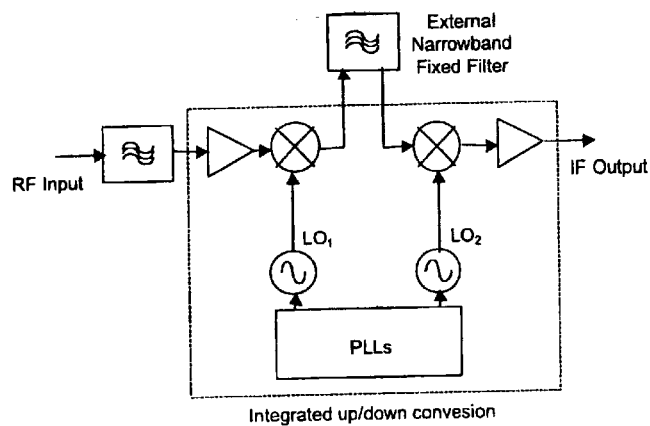
Figure 1: Conventional integrated up/down conversion scheme
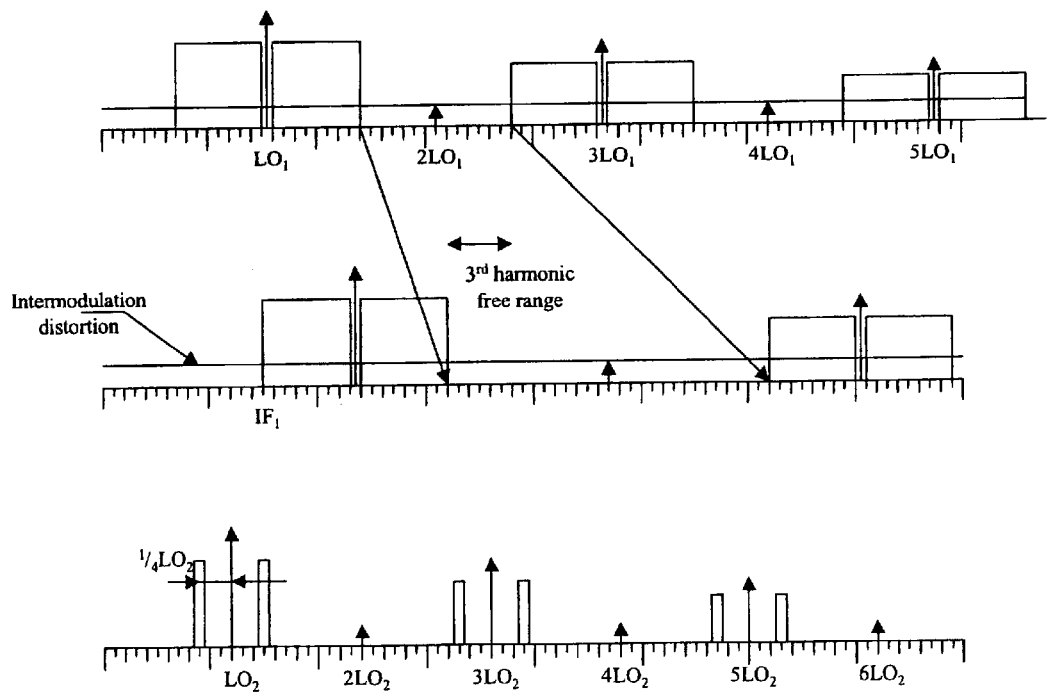
Figure 2: Suggested scheme spectral representation

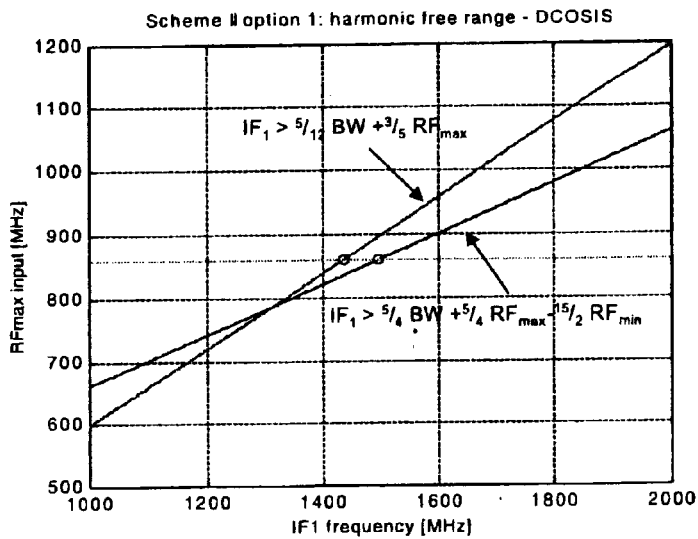
Figure 3: Criteria for IF selection of DOCSIS standard
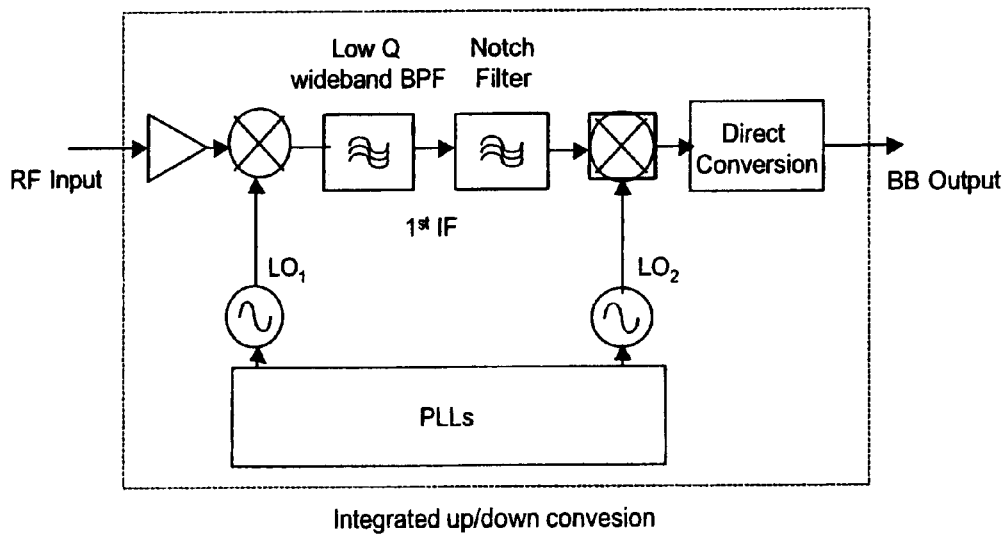
Figure 4: Full 1$^{st}$ IF integrated up/down conversion scheme

METHOD AND APPARATUS FOR HARMONIC FREE GENERATION IN MULTIPLE MIXING FREQUENCY CONVERSION This application claims priority under 35 USC §119(e)(1) of Provisional Application Ser. No. 60/126,804, filed Mar. 30, 1999.

TECHNICAL FIELD OF THE INVENTION

The present invention relates to method and apparatus for harmonic free generation in multiple mixing frequency conversions.

BACKGROUND OF THE INVENTION

One of the major functions of the front-end of a receiver is to provide a frequency conversion from the input RF frequency to a pre-defined IF frequency or baseband. The purpose of the frequency conversion is to perform the demodulation at a fixed center frequency.

There are many different conversions suitable for this purpose. The selection of the specific type of conversion depends on the specific application, performance specifications and cost sensitivity. RF specifications may allow or prevent utilization of a specific type of conversion. For example, sensitivity to local oscillator ("LO") leakage into the RF signal may prevent using a direct conversion scheme, where the RF signal is converted directly to baseband, no matter how efficient the conversion is.

The CATV environment consists of multiple wideband digital and analog carriers, typically covering a frequency range of 54–860 MHz. A receiver for digital modulation is required to demodulate the incoming signal, in the presence of many other signals, some of which are higher in power, and still meet a desired performance. Transmission of digital signals over a cable typically utilizes a very efficient digital modulation, such as 256QAM, where a very high signal-to-noise ratio is required. As a result, the receiver front-end must have a very high rejection of interference from other existing signals, such as images and adjacent signals. For example, if a 256QAM signal requires a signal-to-noise ratio of about 30 dB and is demodulated in the presence of an image which is +10 dBc, the image rejection should be at least 50 dB, for the resulting interference to be 10 dB below the signals' noise level. In such cases, a single conversion may be used to a fixed IF, but will have to use narrowband tracking filters and image rejection mixers to achieve the overall 50 dB image rejection over the full frequency band. Another option is to use a double conversion, where the signal is upconverted to a fixed frequency, filtered with a fixed filter and downconverted to the required IF. The double conversion provides an excellent image rejection but is achieved at an additional cost.

The use of RF CMOS technology for the tuner for digital receivers in a CATV environment offers the ability to integrate all tuner functions into one silicon solution, with a clear cost advantage. On the other hand, other implementation drawbacks arise when such a solution is considered. The isolation and filtering capabilities of RF CMOS are inherently poor. If the use of external components, such as narrowband filters, is to be avoided, then the design of the frequency conversion must be robust enough to minimize relevant interference sources which may reduce the filtering and isolation specifications. A conventional implementation of such an integrated conversion is depicted in FIG. 1.

A double conversion scheme, to a high $2^{nd}$ IF frequency (a few hundred MHz), with an additional complex conversion to baseband, is a candidate for a full integration of the tuner into silicon; this eliminates external components, such as the narrowband fixed filter in the $1^{st}$ IF. If the $2_{nd}$ IF frequency is high enough, the image filtering in the 1st IF becomes feasible. However, double conversion presents many other noise sources that contribute to overall noise and spurious signal levels. Some of the basic sources of interference in such a double conversion are:

1. Conversion of out-of-band signals due to harmonics of the $1^{st}$ and $2^{nd}$ local oscillators ("LO").
2. Intermodulation distortion in the RF/IF path.
3. Limited isolation between different IF frequencies and LO paths in the system.
4. Images due to real conversion.
5. Amplitude and phase mismatch in I/Q and image rejection mixers.

SUMMARY OF THE INVENTION

The present invention provides a frequency selection method (i.e. selection of $1^{st}$, $2^{nd}$ IF frequencies for a given signal bandwidth BW and input frequency range $RF_{min}$ to $RF_{min}$) that inherently isolates and filters major interference sources. The frequency selection method specifically addresses the conversion of out-of-band signals due to local oscillator harmonics, in a double conversion scheme. The method provides a frequency range free of harmonics (i.e. a "Free harmonic range", e.g. a $3^{rd}$ order free harmonic range) and with this, relaxes the filtering requirements for both the input and the $1^{st}$ IF section (e.g. eliminates the need for external narrowband filter in the $1^{st}$ IF section). The frequency selection of the present invention method therefore enables integration of the full tuner into one piece of silicon.

BRIEF DESCRIPTION OF DRAWINGS

For a more complete understanding of the present invention, reference should be made to the accompanying drawings as more fully described in the following detailed description, in which:

FIG. 1 depicts a conventional integrated conversion receiver.

FIG. 2 depicts spectral representations illustrating methods of the present invention.

FIG. 3 depicts criteria for selection of frequencies for an IF converter for the DOCSIS standard.

FIG. 4 depicts an integrated receiver of the present invention.

DETAILED DESCRIPTION

The methods of the present invention are based on the fact that a typical mixer, such as Gilbert type mixer, attenuates the even order harmonics of the local oscillator, due to the nature of the almost square wave switching function of the local oscillator. This results in gaps between the converted input band with the high-level odd order harmonics. Additional noise and interference, mostly from non-linear distortion in the RF/IF path, exist in these gaps. This noise source is basically controlled as opposed to the conversion with the local oscillator harmonics. In the first conversion, the oscillator frequency is selected to convert the incoming signal to a pre-defined $1^{st}$ IF frequency. Since the input signal may exist over a very wide band range, the $1^{st}$ oscillator also varies over a very wide band range. As a result, the gap locations depend on the exact frequency selection. This may lead to a design assumption that around the $1^{st}$ IF frequency there always exists interference and as a result, the conventional approach of using a narrowband filter in the $1^{st}$ IF would be employed.

The odd order harmonics of the local oscillator generally decrease with power. Typical rejections of the $3^{rd}$, $5^{th}$ and $7^{th}$ harmonics are 15 dB, 25 dB and 30 dB respectively. This applies to both the $1^{st}$ and $2^{nd}$ conversions. The methods of the present invention establish a "Harmonic free range", where gaps for the different oscillator frequency selections overlap and allow the conversion of the full input range without the need for band selection input filters and more importantly to minimize the filtering requirements in the $1^{st}$ IF.

FIG. 2 depicts a representative spectral representation of the upconversion and downconversion of the methods of the present invention. The first conversion is done with a local oscillator frequency above the $1^{st}$ IF frequency as described in the two upper Figures. The second conversion is done with an oscillator below the $1^{st}$ IF frequency as described in the lower Figure. There are four alternatives, but this yields both optimal frequency accuracy and a "Free harmonic range". The selection of $2^{nd}$ local oscillator to be a power of 2 times the $2^{nd}$ IF frequency is preferred, but not mandatory. This selection of related frequencies (ratio of 1:4), simplifies the generation of the complex downconversion from $2^{nd}$ IF to baseband. On the other hand, the selection of related frequencies using the 4 to 1 ratio maximizes the result of the tradeoff between image distance from the $1^{st}$ IF frequency (image rejection) and maximizing the input band that can be converted under "Free Harmonic Range".

A "$3^{rd}$ Harmonic Free Range" can be achieved if the $1^{ST}$ IF frequency, the $2^{nd}$ IF frequency, the signal bandwidth (BW) and input band width ($RF_{min}$ to $RF_{max}$) are selected according to the following two relations:

---
$1^{st}$ IF > 5/12 BW + 3/5 $RF_{max}$
$1^{st}$ IF > 5/4 BW + 5/4 $RF_{max}$ − 1512 $RF_{min}$
---

The two equations above are specifically for $2^{nd}$ local oscillator and $2^{nd}$ IF frequencies having the ratio of 4:1 and will change accordingly with ratio changes. The method of the present invention still applies even with if these two parameters do not have this preferred 4:1 ratio.

A typical application where this method applies is the DOCSIS standard for receiving digital cable modem signal with bandwidth of 6 MHz in the range of 88–860 MHz. The "$3^{rd}$ Harmonic Free Range" for this example is illustrated in FIG. 3.

To meet the above two equations, a 1St IF frequency should be selected above 1500 MHz and the full band of 88–860 MHz can be converted without $3^{rd}$ harmonic interference in the up/down conversion scheme. The resulting $1^{st}$ IF filter requires only a 10–15 dB rejection above 5 GHZ and rejection of the specific image frequency. With the use of a low Q internal filter the rejection of the above 5 GHZ signal is easily achieved. The discrete frequency of the image can be rejected with combined image rejection mixer and notch filter at 4/5 of the $1^{st}$ IF frequency, with a typical rejection of 25 dB each. These requirements are feasible even in RF CMOS.

A representative implementation having full integration of the 1st IF filter is depicted in FIG. 4. The additional conversion to baseband implementation is convention and not discussed herein.

What is claimed is:

1. A method for selecting the frequencies of local oscillators and intermediate frequency converters of a receiver, comprising:

selecting the frequency for a first intermediate frequency converter, selecting a frequency for a first local oscillator above the frequency of the first intermediate frequency converter to provide an overlapping harmonic first gap, wherein said first local oscillator (LO) frequency is a power of two times that of said first intermediate frequency (IF) converter; and selecting a frequency for a second local oscillator to provide a harmonic gap overlapping said first gap.

2. The method of claim 1, wherein said first frequencies are selected according to:

1) first IF frequency is greater than the sum of five twelfths times the receiver's input signal band width and three fifths times the input signal upper maximum frequency, and 2) the second IF frequency is greater than the sum of five fourths times the input signal bandwidth and five fourths times the input signal upper maximum frequency reduced by the amount of 1512 times the input signal lower minimum frequency.

3. A receiver, comprising:

a first IF converter with a preselected operating frequency, a low wide Q band first filter connected to the output of said first IF converter, a notch filter connected to the output of said first filter, a second IF converter connected to the output of said notch filter, a first local oscillator having a frequency above said first IF converter frequency connected to said first IF converter, wherein said first local oscillator frequency is a power of two times that of said first IF converter, and a second local oscillator having a frequency less than said first IF converter frequency connected to said second IF converter.

* * * * *